(12) United States Patent
Sengupta et al.

(10) Patent No.: US 7,871,865 B2
(45) Date of Patent: Jan. 18, 2011

(54) STRESS FREE PACKAGE AND LAMINATE-BASED ISOLATOR PACKAGE

(75) Inventors: Dipak Sengupta, Boxboro, MA (US); Thomas Goida, Windham, NH (US)

(73) Assignee: Analog Devices, Inc., Norwood, MA (US)

(*) Notice: Subject to any disclaimer, the term of this patent is extended or adjusted under 35 U.S.C. 154(b) by 889 days.

(21) Appl. No.: 11/626,517

(22) Filed: Jan. 24, 2007

(65) Prior Publication Data

US 2008/0176362 A1 Jul. 24, 2008

(51) Int. Cl.
*H01L 21/00* (2006.01)
(52) U.S. Cl. .................. 438/126; 438/125; 438/123; 438/121; 438/113; 438/111
(58) Field of Classification Search .......... 438/111, 438/112, 113, 121, 123, 125, 126
See application file for complete search history.

(56) References Cited

U.S. PATENT DOCUMENTS

| | | | |
|---|---|---|---|
| 5,559,316 A | 9/1996 | Tomoda | |
| 5,783,465 A | 7/1998 | Canning et al. | |
| 5,903,056 A | 5/1999 | Canning et al. | |
| 5,969,461 A * | 10/1999 | Anderson et al. | 310/313 R |
| 6,553,660 B2 | 4/2003 | Nakamura | |
| 2006/0164466 A1 | 7/2006 | Mizuno et al. | |
| 2006/0249840 A1* | 11/2006 | Sutardja | 257/729 |
| 2007/0108565 A1* | 5/2007 | Shim et al. | 257/676 |

FOREIGN PATENT DOCUMENTS

| | | |
|---|---|---|
| JP | 09036143 | 2/1997 |
| JP | 10092875 | 4/1998 |
| JP | 2002 198397 | 7/2002 |
| JP | 2002198397 | 7/2002 |
| WO | 9952209 | 10/1999 |

OTHER PUBLICATIONS

Zhong, "Various Adhesives for Flip Chips" Journal of Electronic Packaging, Mar. 2005, vol. 127, pp. 29-32.
Authorized Officer Nicola Crampin, *International Search Report and Written Opinion of the International Searching Authority*, International Searching Authority, International Application No. PCT/US2008/051615, Sep. 17, 2008, 8 pages.
Authorized Officer—Beate Giffo-Schmitt, *International Preliminary Report on Patentability*, No. PCT/US2008/051615, Jan. 24, 2007, 14 pages.

* cited by examiner

*Primary Examiner*—Mary Wilczewski
*Assistant Examiner*—Telly D Green
(74) *Attorney, Agent, or Firm*—Sunstein Kann Murphy & Timbers LLP

(57) ABSTRACT

Various methods are described where the semiconductor die and the lead frame (or the BGA or LGA substrate) are spaced apart to reduce stress. In one scenario, an air gap is formed between the semiconductor die and the lead frame by depositing a perimeter (made, for example, using polymer) either on the semiconductor die or the lead frame. In another scenario, an anisotropic conducting film (ACF) is formed with an air gap between the semiconductor die and the lead frame (or the BGA or LGA substrate). The air gap relieves stress on the semiconductor die. Further, a lead frame-based isolator package and a BGA (or LGA) isolator package are described. A window-frame ACF-based isolation method for magnetic coupling in a lead-frame package and BGA (or LGA) package is also described.

17 Claims, 15 Drawing Sheets

202  FIGURE 2a

Cross section of final assembly

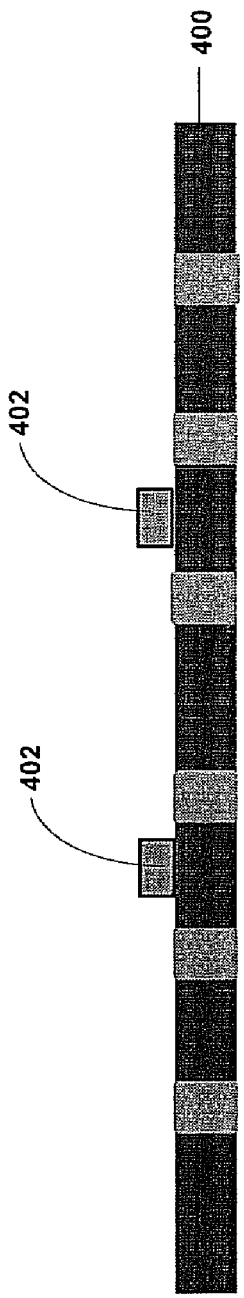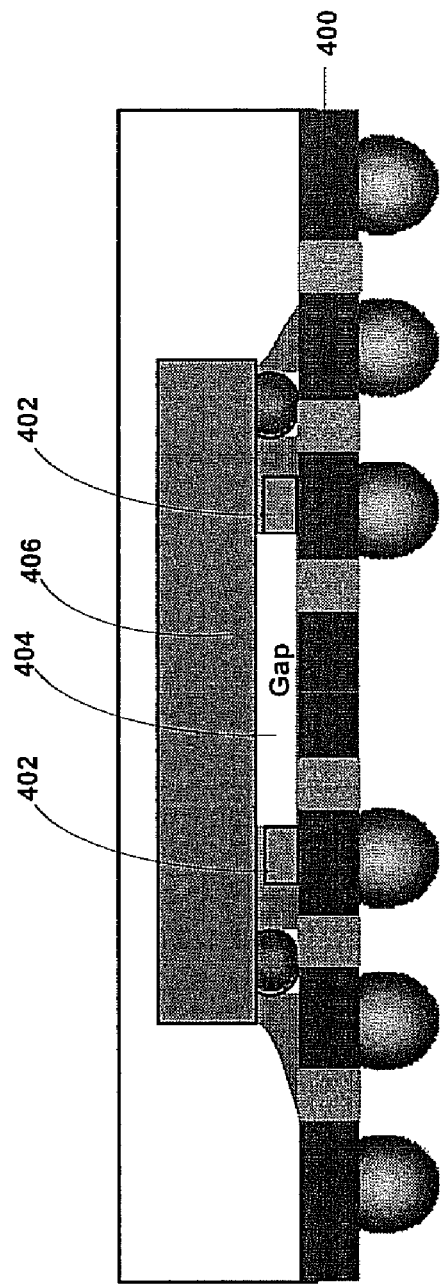
FIGURE 4a
FIGURE 4b

STRESS FREE PACKAGE AND LAMINATE-BASED ISOLATOR PACKAGE

BACKGROUND OF THE INVENTION

1. Field of Invention

The present invention relates generally to the field of semiconductor packaging. More specifically, the present invention is related to a stress free package having a stress free region and a laminate-based isolator package.

2. Discussion of Prior Art

A semiconductor die can be negatively impacted by the packaging process. The packaging process typically entails encapsulating the semiconductor device with a plastic mold compound or other polymer based encapsulant. This process results in direct physical contact between the semiconductor die surface with its active components and the mold compound encapsulant. This direct contact can cause a fluctuation in the performance and reliability of the product. In high-performance semiconductor packaging structures, a temperature coefficient mismatch occurs due to the uneven expansion of the mold as compared to the silicon die whereby localized stress caused by the expansion affects resistor shift values.

A prior art solution to combat such uneven expansion involved trimming, but trimming increased the cost of production of the dies. Another prior art solution involved the addition of particles to the mold to match the temperature mismatch.

A prior art solution to avoid such direct contact to improve performance and reliability involved the application of silicone gel on top of the die to prevent the mold compound from getting in direct contact with stress sensitive areas of the die surface for non-micromachined products.

The patent to Canning (U.S. Pat. No. 5,783,465) teaches an interconnection technique using compliant metal coated photodefined polymer bumps for mounting and interconnecting component assemblies on substrates such as glass, printed wiring boards, etc., wherein the polymer chosen for the bump structure has a relatively low $T_g$ and the polymer bump is metallized in a way that substantially encapsulates the polymer.

The patent to Canning et al. (U.S. Pat. No. 5,903,056) teaches a thermocompression bonding process using anisotropic conductive film (ACF) bonding material in which the bonding pads are shaped to prevent depletion of conductive particles in the bonding region during compression, wherein the shaped structure can be made using photodefinable polymer strips around the bonding pads where the strips are thicker than the bonding pad.

The patent to Nakamura (U.S. Pat. No. 6,553,660) teaches a method of manufacturing an electronic device including a first electronic component mounted on one main surface of a wiring board by thermo-compression bonding with an adhesive resin interposed between a first area of the one main surface of the wiring board and the first electronic component, and a second electronic component mounted on a second area by melting a soldering paste material, wherein the first electronic component is mounted before the mounting of the second electronic component.

The patent publication to Mizuno et al. (U.S. 2006/0164466) teaches a device package method comprising: preparing a base body having a conductive connection portion and a level difference portion; arranging a device having a connection terminal, on the base body; arranging a connector on the base body, the connector having substantially the same height as a height of the level difference portion formed between the connection terminal of the device and the conductive connection portion, when the device is arranged on the base body; electrically connecting the connector to the conductive connection portion; electrically connecting the connection terminal of the device to the connector; and electrically connecting the connection terminal and the conductive connection portion.

The paper to Zhong titled "Various Adhesives for Flip Chips" discloses a packaging process using anisotropic conductive paste and a stud bump bonding process with reduced process steps, whereby curing of conductive adhesive and underfill epoxy is not required, resulting in reduced packaging time.

Whatever the precise merits, features, and advantages of the above cited techniques, none of them achieves or fulfills the purposes of the present invention.

SUMMARY OF THE INVENTION

The present invention provides for a method to reduce stress in a semiconductor package comprising: (a) selecting a stress sensitive area on a semiconductor die; (b) depositing a perimeter (formed, for example, using a polymer) around the stress sensitive area on the semiconductor die; and (c) forming an air gap by contacting the semiconductor die having the deposited perimeter with a lead frame, wherein the formed air gap prevents underfill or molding compound from coming in contact with said stress sensitive area on the semiconductor die.

The present invention also provides for a method to reduce stress in a semiconductor package comprising: (a) selecting a stress sensitive area on a semiconductor die; (b) depositing a perimeter (formed, for example, using a polymer) on a lead frame; and (c) contacting the lead frame having the perimeter with the semiconductor die, wherein the perimeter forms an air gap and prevents underfill or molding compound from coming in contact with said stress sensitive area on the semiconductor die.

The present invention also provides for a method to produce a laminate that aids in reducing package stress comprising: identifying known dimensions associated with a specific semiconductor die; and depositing a perimeter on a laminate, wherein the perimeter is dimensioned such that an air gap is formed when the specific semiconductor die of know dimensions is placed on top of the laminate.

The present invention also provides for a method to form a stress free package comprising the steps of: depositing a first perimeter on a laminate; depositing a second perimeter on a semiconductor die; and forming an air gap by placing the semiconductor die with the second perimeter on the laminate with the first perimeter, wherein the formed air gap prevents underfill or molding compound from coming in contact with the stress sensitive area on the semiconductor die.

The present invention provides a window frame ACF-based stress isolation method for a lead frame package comprising the steps of: (a) applying an ACF layer on a polyimide layer on lead frame die attach paddle; and (b) bonding a die to the applied ACF layer, wherein the ACF layer provides stress isolation to the die by forming a gap in between the die and the polyimide layer.

The present invention also provides a multi-tier ACF-based stress isolation method for a lead frame package comprising the steps of: (a) applying an multi-tier ACF film with a notch on a polyimide layer on lead frame die attach paddle; and (b) bonding a die to the applied multi-tier ACF film with the notch, wherein the bonding is done such that the notch is disposed between said die and said polyimide layer and wherein the multi-tier ACF film provides stress isolation to the die via the notch.

The present invention also provides a window frame ACF-based stress isolation method for a BGA (or LGA) package comprising the steps of: (a) applying an ACF layer on a BGA (or LGA) substrate; and (b) bonding a die to the applied ACF layer, wherein the ACF layer provides stress isolation to the die by forming a gap in between said die and said BGA (or LGA) substrate.

The present invention also provides a window frame ACF-based stress isolation method for a BGA (or LGA) package comprising the steps of: (a) applying a multi-tier ACF film with a notch on a BGA (or LGA) substrate; and (b) bonding a die to the applied ACF layer, wherein the bonding is done such that the notch is disposed between the die and the BGA (or LGA) substrate and wherein the mutli-tier ACF film provides stress isolation to the die via the notch.

The present invention also provides a window-frame ACF-based isolation method for magnetic coupling in a lead frame package comprising the steps of: (a) applying an ACF layer on a polyimide layer on lead frame die attach paddle, wherein the ACF layer has a first metal trace; and (b) bonding a die to the applied ACF layer, wherein the die has a second metal trace and wherein the ACF layer isolates the first and second metal traces and the isolated first and second metal traces provide magnetic coupling.

The present invention also provides for a window-frame ACF-based isolation method for magnetic coupling in a BGA (or LGA) package comprising the steps of: (a) applying an ACF layer on a BGA (or LGA) substrate, wherein the ACF layer has a first metal trace; and (b) bonding a die to the applied ACF layer, wherein the die has a second metal trace and wherein the ACF layer isolates the first and second metal traces, with the isolated first and second metal traces providing magnetic coupling.

The present invention also provides for a method to reduce stress in a semiconductor package comprising: (a) depositing an anisotropic conducting film (ACF) on a semiconductor die, said ACF film further containing gold stud bumps; and (b) forming an air gap by contacting the semiconductor die having the deposited ACF film with gold stud bumps with a lead frame, wherein the formed air gap prevents underfill or molding compound from coming in contact with said stress sensitive area on the semiconductor die.

The present invention also provides for a method to reduce stress in a semiconductor package comprising: (a) depositing a continuous anisotropic conducting film (ACF) on a semiconductor die, said ACF film further having a plurality of gold stud bumps dispersed within; and (b) contacting said semiconductor die having said deposited ACF film with gold stud bumps with a lead frame, wherein said ACF film with gold stud bumps prevents underfill or molding compound from coming in contact with said stress sensitive area on the semiconductor die.

The present invention also provides for a method to reduce stress in a semiconductor package comprising: (a) depositing a notched anisotropic conducting film (ACF) on a semiconductor die, said ACF film further containing gold stud bumps; and (b) forming an air gap by contacting the semiconductor die having the notched ACF film with gold stud bumps with a lead frame, wherein the formed air gap prevents underfill or molding compound from coming in contact with said stress sensitive area on the semiconductor die.

BRIEF DESCRIPTION OF THE DRAWINGS

FIGS. 2a and 2b illustrates a cross section of the final assembly according the embodiment shown in FIG. 1

FIG. 3b illustrates a cross section of the final assembly formed using the options shown in FIG. 3a.

FIG. 4a illustrates another aspect of the invention wherein a laminate already has a soldermask perimeter is used.

FIG. 4b illustrates a cross section of the final assembly formed using the procured laminate of FIG. 4a.

DESCRIPTION OF THE PREFERRED EMBODIMENTS

Figure 1:
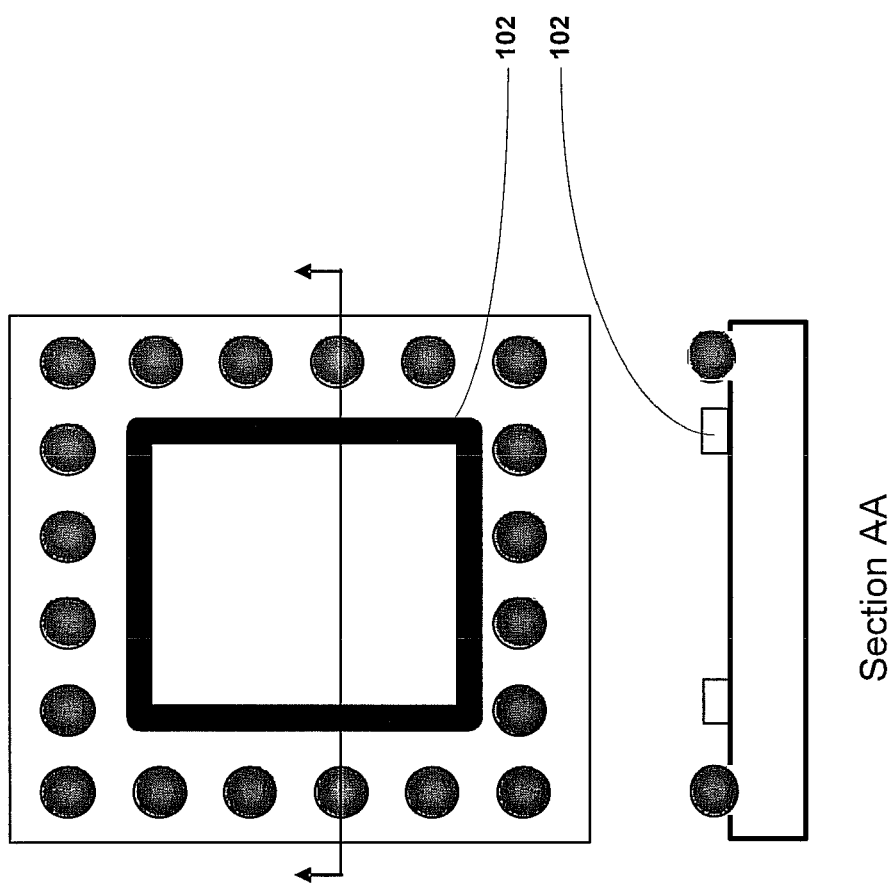
FIG. 1 illustrates a stress free package according to one aspect of the present invention wherein an air cavity is created by depositing a perimeter, preferably made of polymer.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Figure 2B:
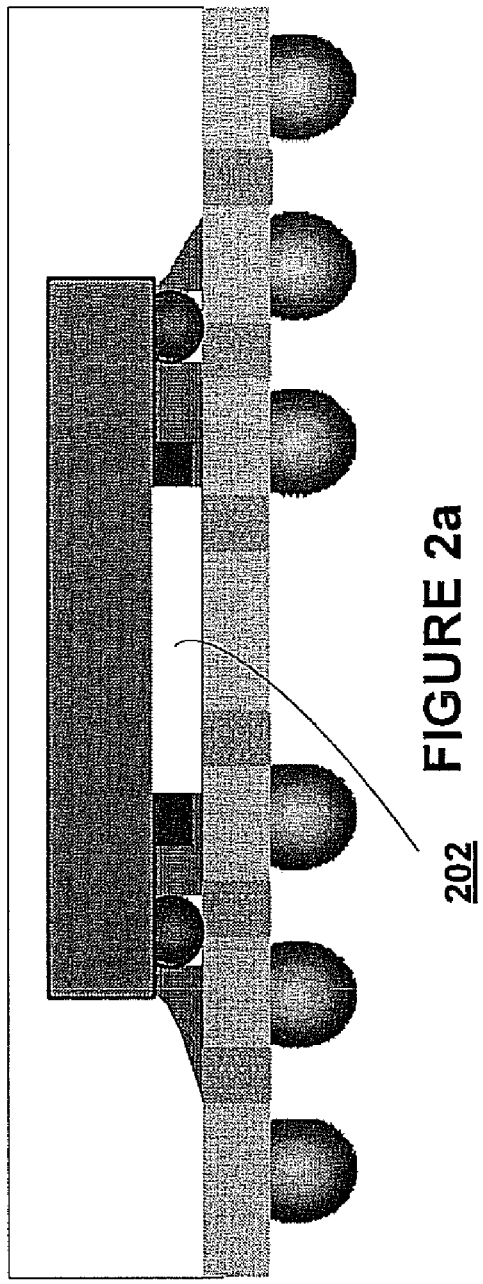

FIG. 1 illustrates a stress free region packaging according to one aspect of the present invention wherein an air cavity is created by depositing a perimeter 102, preferably made of polymer, around an element in the semiconductor die that is susceptible to stress. Although the specific example of polymer is used, it should be noted that other material such as (but not limited to) ceramics with adhesives or non-conductive conductive silicon can be used in conjunction with the present invention. Further, it should be noted that the deposited perimeter does not have to be continuous, but can be substantially continuous. FIGS. 2a and 2b illustrates a cross section of the final assembly according the embodiment shown in FIG. 1. According to this embodiment, an air gap 202 is created by depositing a perimeter, preferably made of polymer, wherein the perimeter prevents the underfill or molding compound from coming in contact with the die surface.

The method according this aspect of the invention comprises the steps of: (a) selecting a stress sensitive area on a semiconductor die; (b) depositing a polymer perimeter (e.g., via screen printing on the wafer) around said stress sensitive area on the semiconductor die; and (c) forming an air gap by contacting said semiconductor die having said deposited perimeter with a lead frame, wherein the formed air gap prevents underfill or molding compound from coming in contact with said stress sensitive area on the semiconductor die.

Figure 2B:
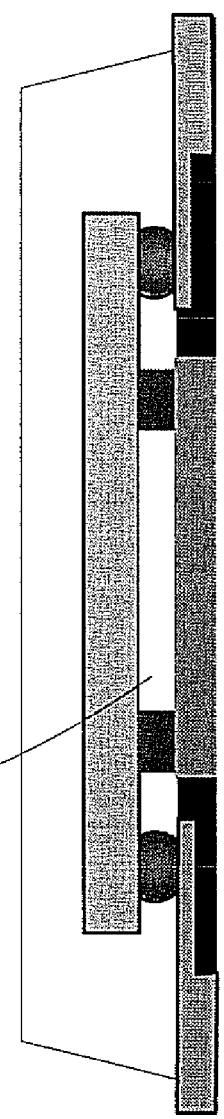
Figure 3B:
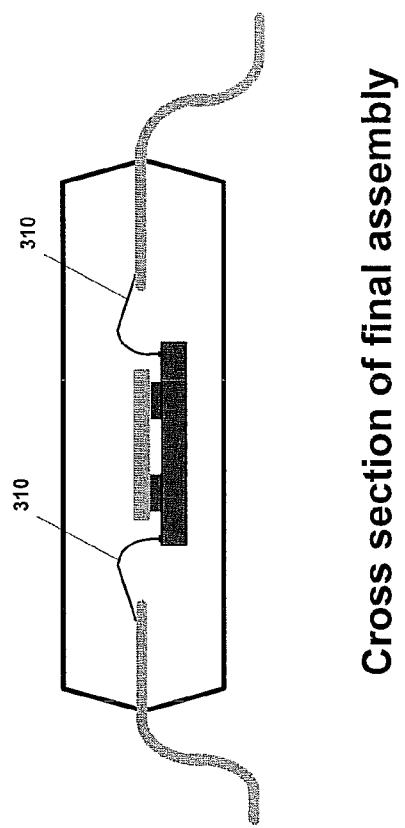
Figure 3A:
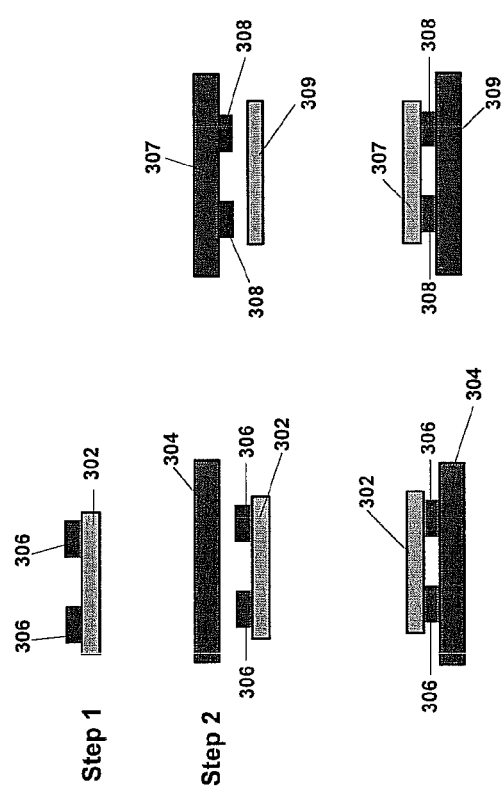
FIG. 3a illustrates two options that can be used to form the air gap shown in FIGS. 1 and 2.

FIG. 3a illustrates two options that can be used to form the air gap shown in FIGS. 1 and 2. According to Option A, the polymer 306 is deposited on the lead frame 302, wherein the combination of the lead frame and the perimeter of polymer is contacted with the semiconductor die 304. According to Option B, the polymer 308 is deposited on the semiconductor die 307 (this can be achieved by depositing polymer 308 on the semiconductor die or at wafer level) wherein the combination of the die and the perimeter of polymer is contacted with the lead frame 309.

Both options result in the formation of an air gap between the die and the lead frame.

FIG. 3b illustrates a cross section of the final assembly based on both the above-described options. In FIG. 3b, the package comprises: the leadframe (302 or 309), polymer (306 or 308), the semiconductor (304 or 307), and wire bonds 310.

FIG. 4a illustrates another aspect of the invention wherein a laminate 400 already has a soldermask perimeter 402. FIG. 4b illustrates a cross section of the final assembly formed using the procured laminate 400 of FIG. 4a. Bump pads can be non-soldermask soldermask defined. This aspect is especially useful when the design of the die to be packaged is known a priori.

According to this aspect of the present invention, the method teaching stress free region packaging comprises: identifying known dimensions associated with a specific semiconductor die; and depositing a perimeter 402 on a laminate 400, wherein the perimeter 402 is dimensioned such that an air gap 404 is formed when the specific semiconductor die 406 of know dimensions is placed on top of said laminate 400.

Figure 5A:
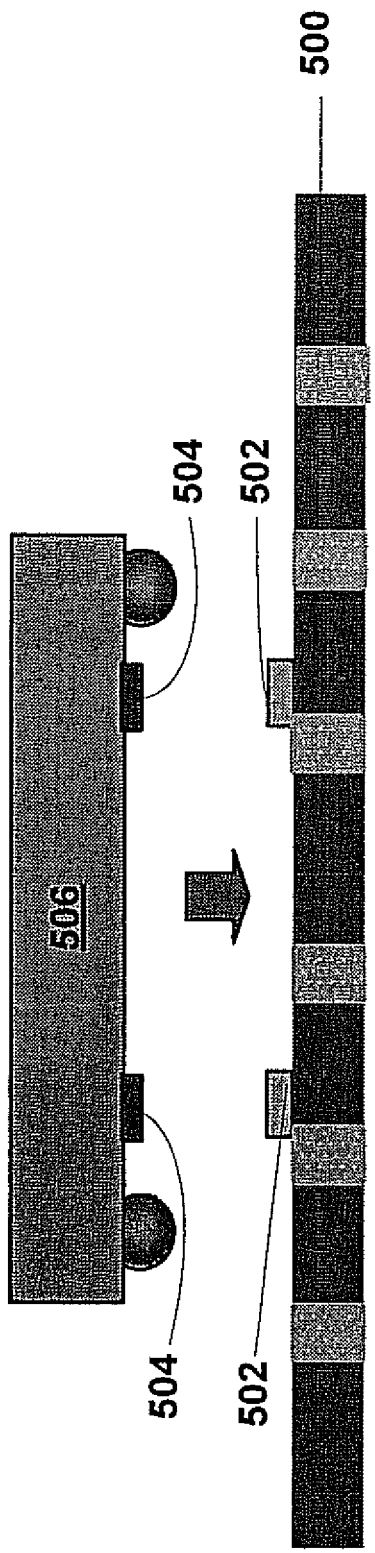
FIG. 5a-b illustrates another aspect of the present invention, which uses a combination of the techniques used to form the final assemblies shown in FIGS. 3a-b and 4a-b.
Figure 5B:
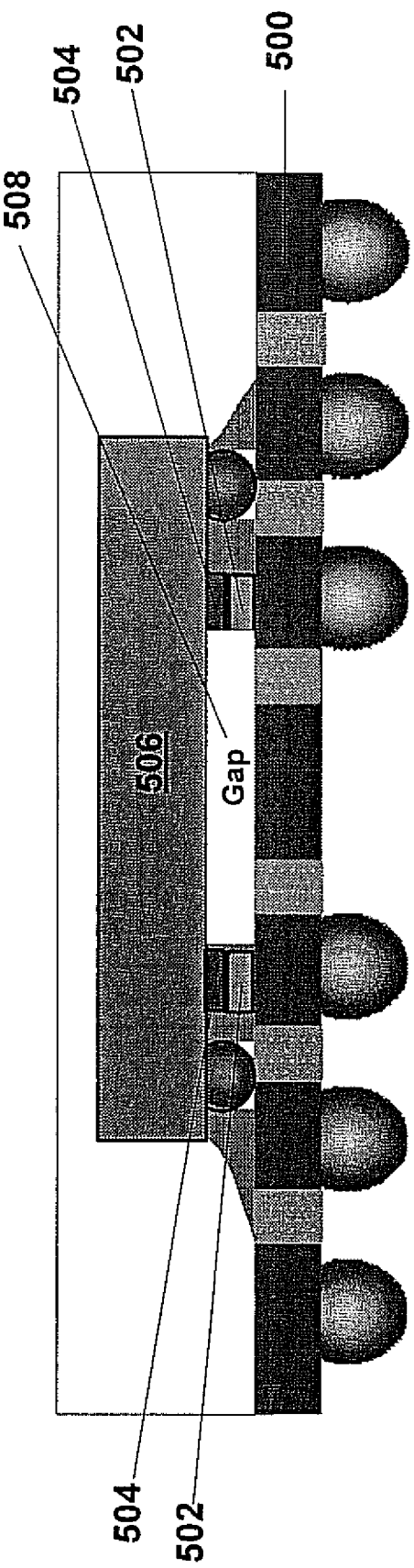

FIG. 5a-b illustrates another aspect of the present invention, which is a combination of the techniques used to form the final assemblies shown in FIGS. 3a-b and 4a-b. According to this aspect of the present invention, the method teaching stress free region packaging comprises: depositing a first perimeter 502 on a laminate 500, depositing a second perimeter 504 on a semiconductor die 506 or at wafer level; and forming an air gap 508 by placing the semiconductor die 506 with the second perimeter 504 on the laminate 500 with the first perimeter 502. It should be noted that the material used to form the first perimeter (on the laminate) can be different than the material used to form the second perimeter (on the die).

Figure 6D:
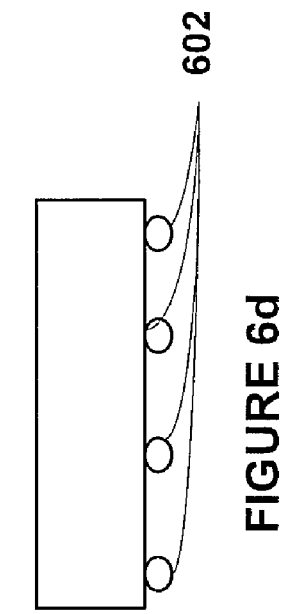
FIG. 6d illustrates a cross-sectional view of a die with a plurality of gold stud bumps.
Figure 6A:
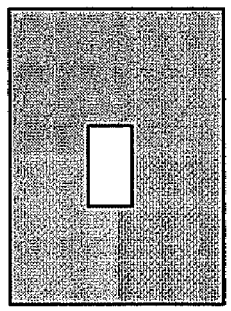
FIG. 6a illustrates a top view of a window frame ACF.
Figure 6B:
FIG. 6b illustrates a cross-section of FIG. 6a's window frame ACF as used in conjunction with the present invention.
Figure 6C:
FIG. 6c illustrates a cross-section of a multi-tiered ACF (having a notch) as used in conjunction with the present invention.

The Anisotropic Conductive Film (ACF) referenced with respect to the present invention is made of polymeric material impregnated with conductive particles designed in such a manner that the particles conduct in Z-direction only when used as interconnect between active I/Os of silicon and package substrate (lead frame or laminate based)—wherein the typical attachment process of the semiconductor die to leadframe or laminate is via thermo-compression bonding. FIG. 6a illustrates a top view of a window frame ACF. FIG. 6b illustrates a cross-section of FIG. 6a's window frame ACF as used in conjunction with the present invention. FIG. 6c illustrates a cross-section of a multi-tiered ACF (having a notch) as used in conjunction with the present invention.

Gold stud bumps are typically formed on active bond pads of the semiconductor die in the wafer level. This ensures that all dies, prior to ACF assembly, have the gold bumps to aid in die interconnect—this is consistent with high volume production. FIG. 6d illustrates a cross-sectional view of a die with a plurality of gold stud bumps 602.

Figure 7A:
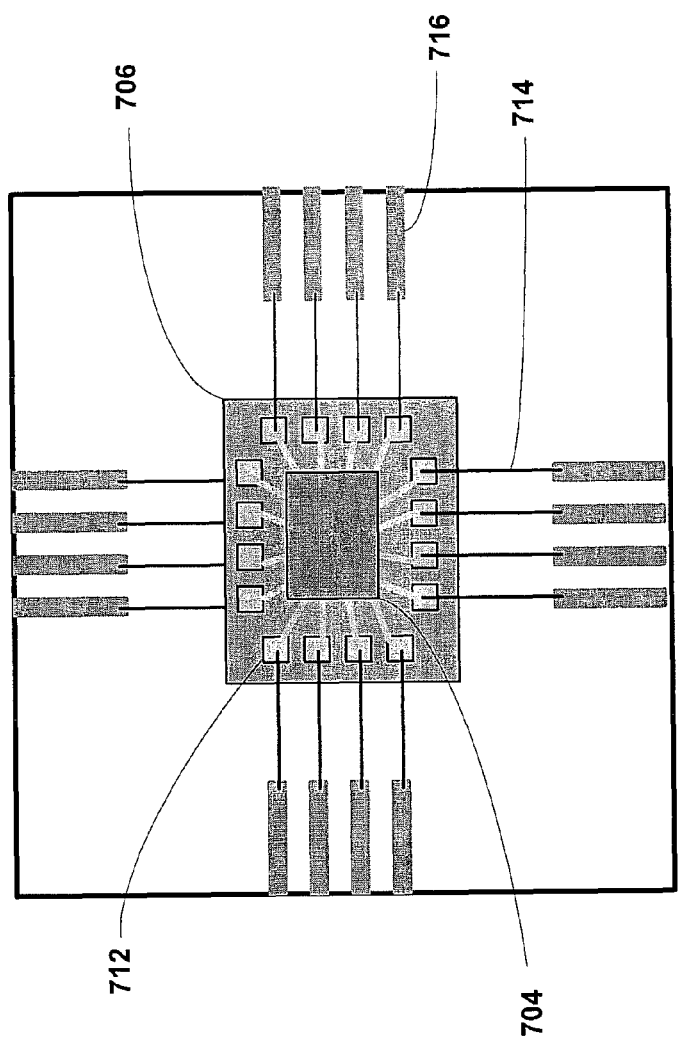
FIGS. 7a-b illustrate one embodiment of the present invention providing window frame ACF-based stress isolation in a lead frame package.
Figure 7B:
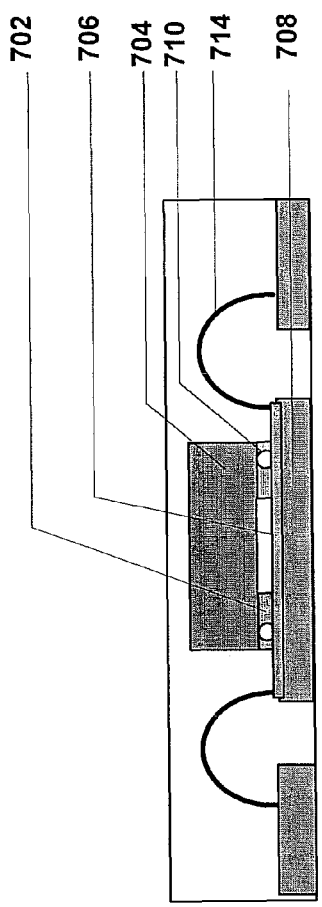

FIGS. 7a-b illustrate one embodiment of the present invention providing window frame ACF-based stress isolation in a lead frame package. FIGS. 7a and 7b illustrate a top view and cross-section view, respectively. In this embodiment, ACF 702 is disposed between the flipped die 704 (wherein the flipped die is connected to the polyimide 706 on lead frame 708 via gold bumps 710 and ACF 702) and polyimide layer 706. Polyimide layer 706 is adhesive attached to die pad of leaframe package. In FIG. 7a, the gold traces and bond pads 712 are formed on the polyimide layer 706 and the wire bonds link the bond pads 712 with the leads 716. It can be seen from the cross-section shown in FIG. 7b, ACF 702 provides stress isolation by forming a gap in between the semiconductor die 704 and the polyimide layer, thereby relieving the semiconductor die 704 of any stress that it might have been subjected to due to contact.

Figure 8:
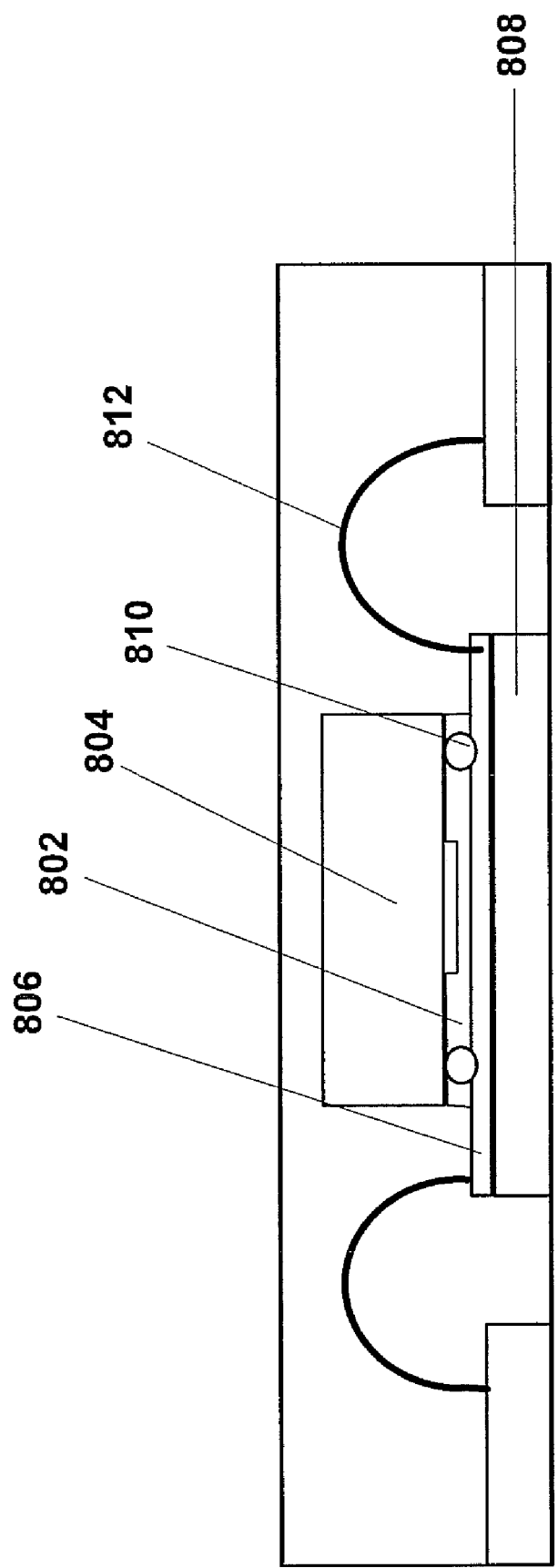
FIG. 8 illustrates another embodiment of the present invention providing window frame ACF-based stress isolation in a lead frame package using an alternate multi-tier ACF film design.

FIG. 8 illustrates another embodiment of the present invention providing window frame ACF-based stress isolation in a lead frame package using an alternate multi-tier ACF film design. FIG. 8 illustrates a cross-section view of this embodiment. In this embodiment, a multi-tiered ACF film (with a notch) 802 is disposed between the die 804 (wherein the die 804 is connected to the polyimide 806 on lead frame 808 via gold bumps 810 and ACF 802) and polyimide layer 806. The wire bonds 812 link the bond pads with the leads. It can be seen from the cross-section shown in FIG. 8, the multi-tiered ACF film (with a notch) 802 provides stress isolation by forming a gap in between the semiconductor die 804 and the polyimide layer, thereby relieving the semiconductor die 804 of any stress that it might have been subjected to due to contact.

Figure 9:
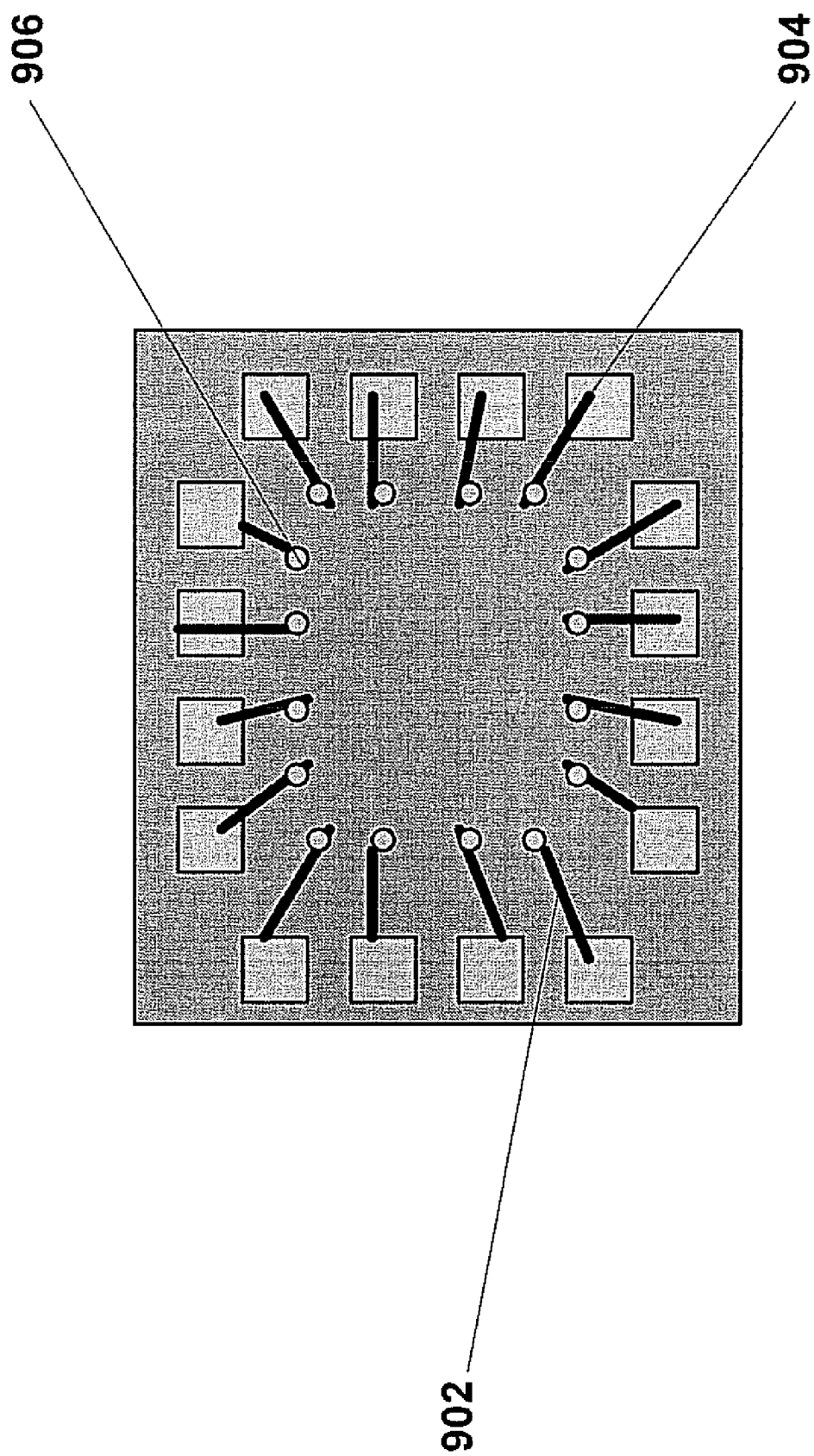
FIG. 9 illustrates details of polyimide tape used to attach to die paddle of lead frame package.

FIG. 9 illustrates details of polyimide tape used to attach to die paddle of lead frame package. In FIG. 9, gold metal traces 902 connect the gold land for wire bond 904 with gold land for gold bump 906. The polyimide tape top-side has a gold metal pattern for die attachment, metal routing and wire bond. The polyimide tape backside has adhesive for attachment to the die paddle.

The assembly process for the lead frame package embodiment comprises: (a) formation of gold stud bump at the wafer level; (b) applying ACF material on the lead frame die attach paddle (it should be noted that the lead frame die attach paddle has polyimide metal interconnects); singulating die and thermo-compression bonding to ACF; wire bonding; and molding, wherein the finished package is realized using a standard lead frame process Although examples are shown for specific Ball Grid Array (BGA) implementations, it should be noted that the teachings of the present invention can also be applied to Land Grid Arrays (LGA) without departing from the scope of the invention. LGAs have a similar structure to BGA, except that they do not have external solder balls as in BGA. In LGA, the next level interconnect is made possible through gold lands instead of solder balls. LGA is sometimes preferred as it is thinner and as it provides better thermal performance.

Figure 10C:
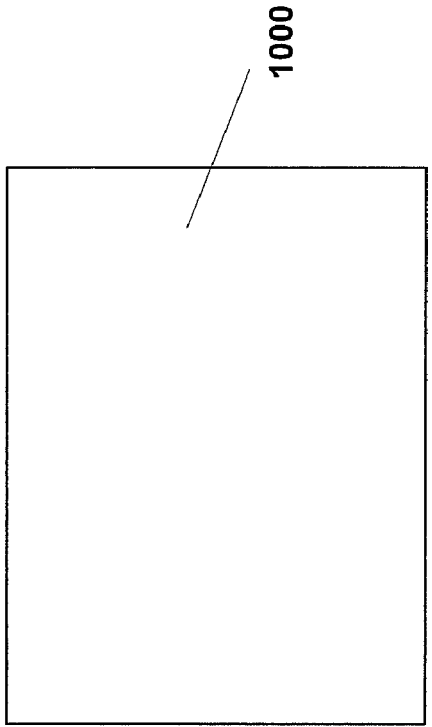
FIGS. 10a-d illustrate another embodiment of the present invention providing window frame ACF-based stress isolation in a BGA (or LGA) package.
Figure 10D:
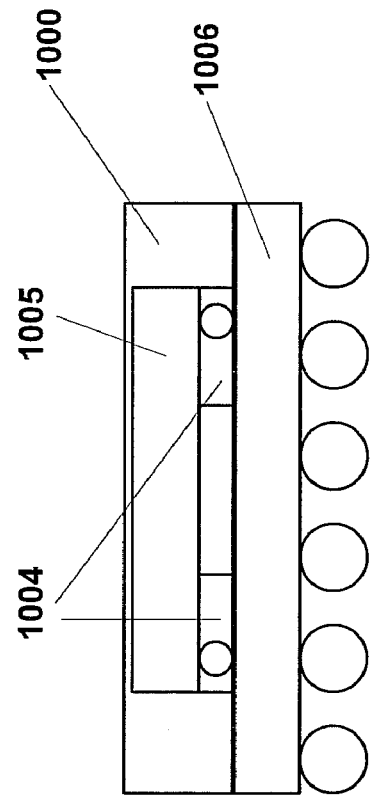
Figure 10A:
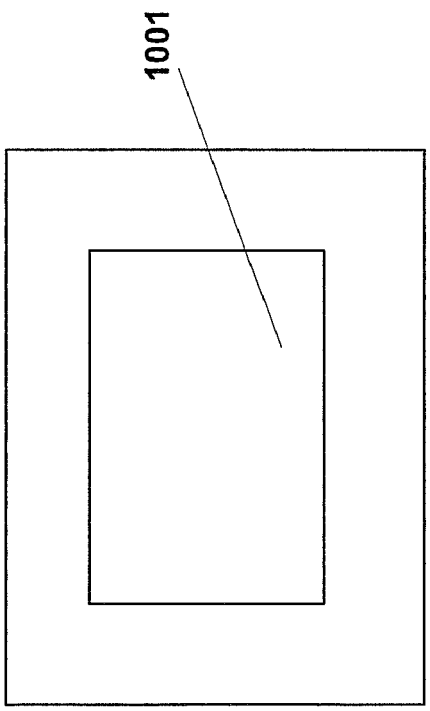
Figure 10B:
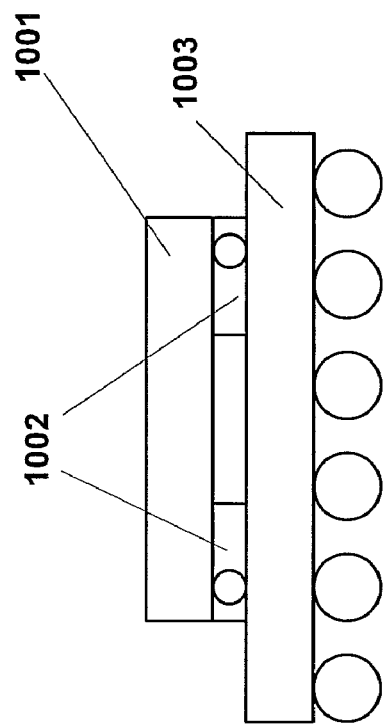

FIGS. 10a-d illustrate another embodiment of the present invention providing window frame ACF-based stress isolation in a laminate based (like BGA, LGA) package. FIGS. 10a-b illustrate a top view and a cross-section of package where the die in the BGA (or LGA) package is exposed. FIGS. 10c-d illustrate a top view and a cross-section of package where the BGA (or LGA) package is overmolded (molding layer 1000). It should be noted that in the BGA (or LGA) package embodiment of the present invention, there is no polyimide interconnect (as opposed to the lead frame package embodiments of FIGS. 7-9) as metal interconnect is possible using the BGA (or LGA) substrate. In the exposed scenario of FIG. 10a-b, ACF film 1002 isolates stress on exposed die 1001 by forming a gap between exposed die 1001 and substrate 1003. Similarly, in the overmolded scenario of FIGS. 10c-d, the ACF film 1004 isolates stress on die 1005 by forming a gap between die 1005 and substrate 1006.

Figure 11C:
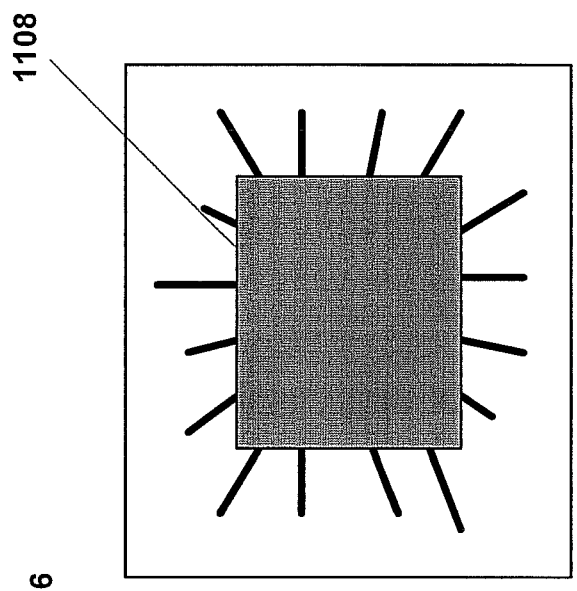
FIGS. 11 a-c illustrate a general outline of the BGA (or LGA) assembly steps for an exposed die.
Figure 11B:
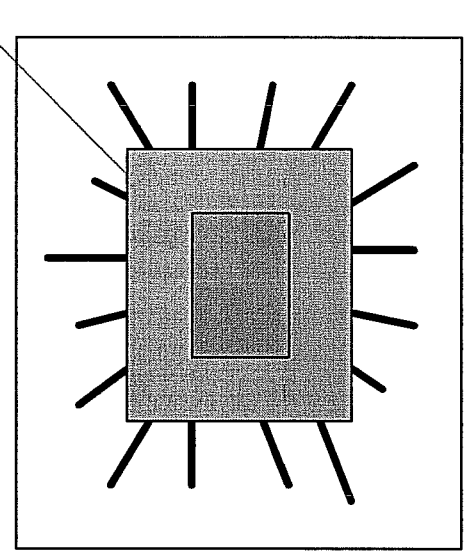
Figure 11A:
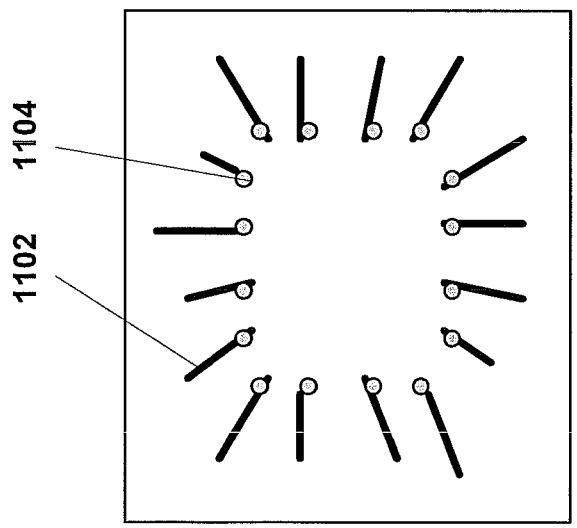

FIGS. 11a-c illustrate a general outline of the BGA (or LGA) assembly steps for an exposed die. FIG. 11a illustrates a BGA (OR LGA) substrate with standard gold metal routing traces 1102 and gold lands 1104 for gold bump attach using ACF. FIG. 11b illustrates the laminate substrate with ACF 1106. FIG. 11c illustrates a BGA (or LGA) substrate with die 1108 attached using window frame ACF. The assembly process for the BGA (or LGA) package embodiment comprises: forming gold stud bumps at the wafer level; applying ACF material on BGA (or LGA) Laminate (as noted above, there is no polyimide interconnect in this package version since metal interconnect is possible using BGA (or LGA) substrate); singulating die and thermo-compression bonding to ACF (It should be noted that there is no wirebond in the BGA (or LGA) package); and molding, wherein the finished package is realized using a standard BGA (or LGA) assembly process.

Figure 12B:
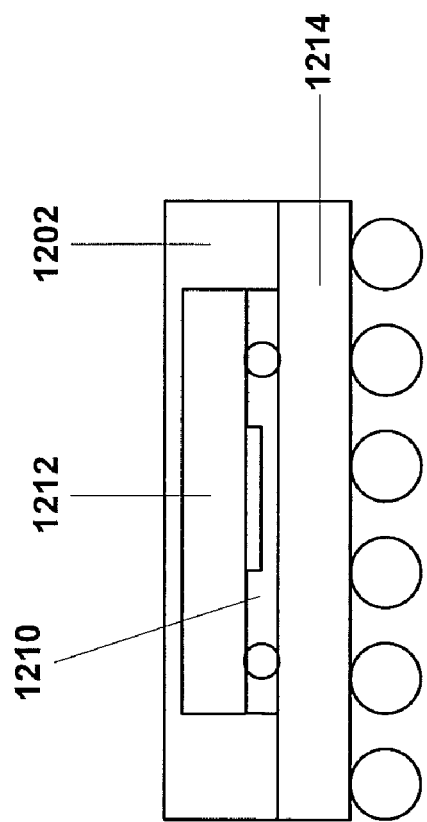
FIGS. 12a-b illustrate another embodiment of the present invention providing window frame ACF-based stress isolation in a BGA (or LGA) package using an alternate multi-tier ACF film design.
Figure 12A:
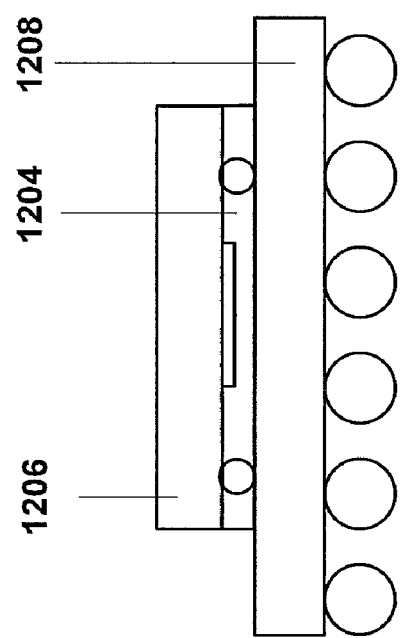

FIGS. 12a-b illustrate another embodiment of the present invention providing window frame ACF-based stress isolation in a BGA (or LGA) package using an alternate multi-tier ACF film design. FIGS. 12a illustrates a cross-section of package where the die in the BGA (or LGA) package is exposed. FIGS. 12b illustrates a cross-section of package where the BGA (or LGA) package is overmolded (molding layer 1202). In the exposed scenario of FIG. 12a, multi-tier ACF film 1204 (with a notch) isolates stress on exposed die 1206 by forming a gap between exposed die 1206 and substrate 1208. Similarly, in the overmolded scenario of FIG. 12b, multi-tier ACF film 1210 (with a notch) isolates stress on die 1212 by forming a gap between die 1212 and substrate 1214.

Figure 13:
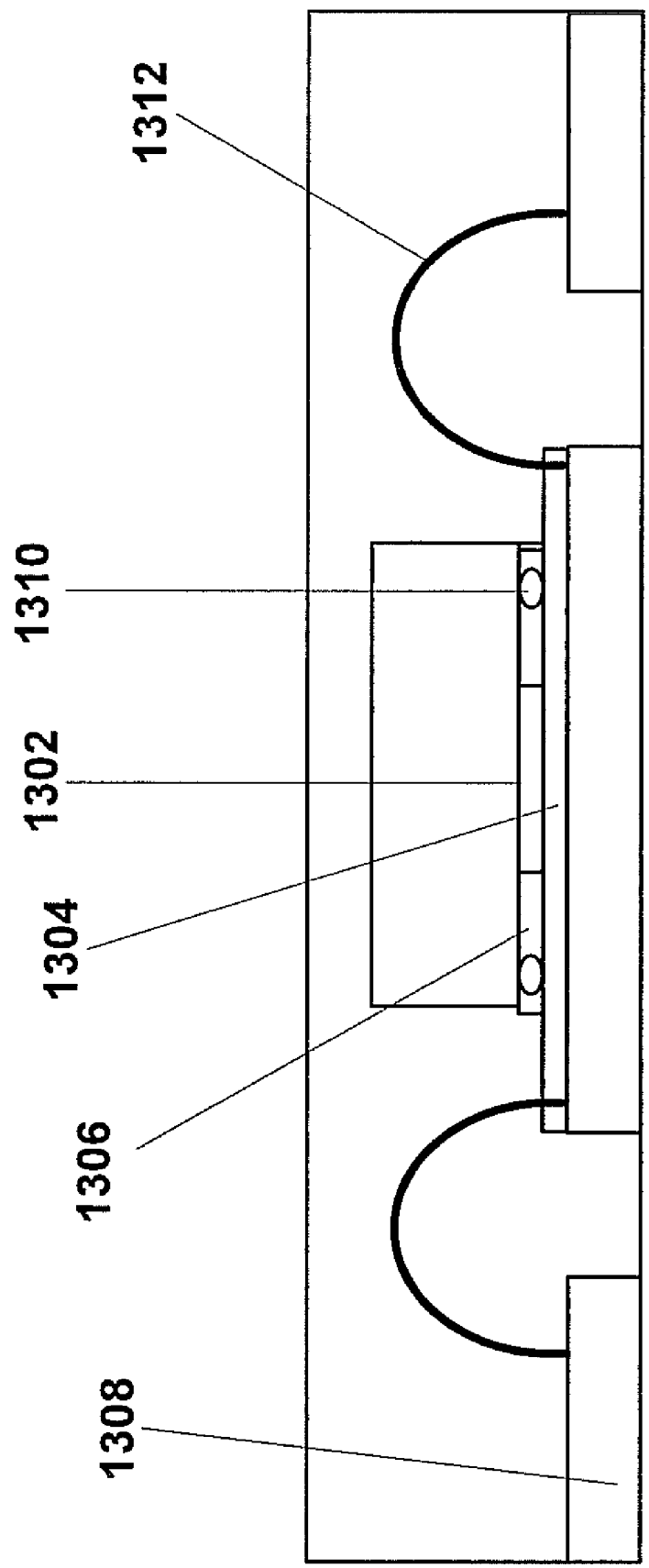
FIG. 13 illustrates another embodiment of the present invention providing a lead frame-based isolator package.

FIG. 13 illustrates another embodiment of the present invention providing a lead frame-based isolator package. According to this embodiment, metal lines formed on die 1302 and metal lines formed on polyimide layer 1304 form isolated metal lines for magnetic coupling. In this embodiment, ACF 1306 is disposed between element 1302 (wherein 1302 is connected to the polyimide 1304 on lead frame 1308 via gold bumps 1310 and ACF 1306) and polyimide layer 1304. The wire bonds 1312 link the bond pads with the leads. It can be seen from the cross-section shown in FIG. 8, ACF film 1306 provides isolation between the metal lines disposed on die 1302 and polyimide layer 1304, thereby providing magnetic coupling.

Figure 14:
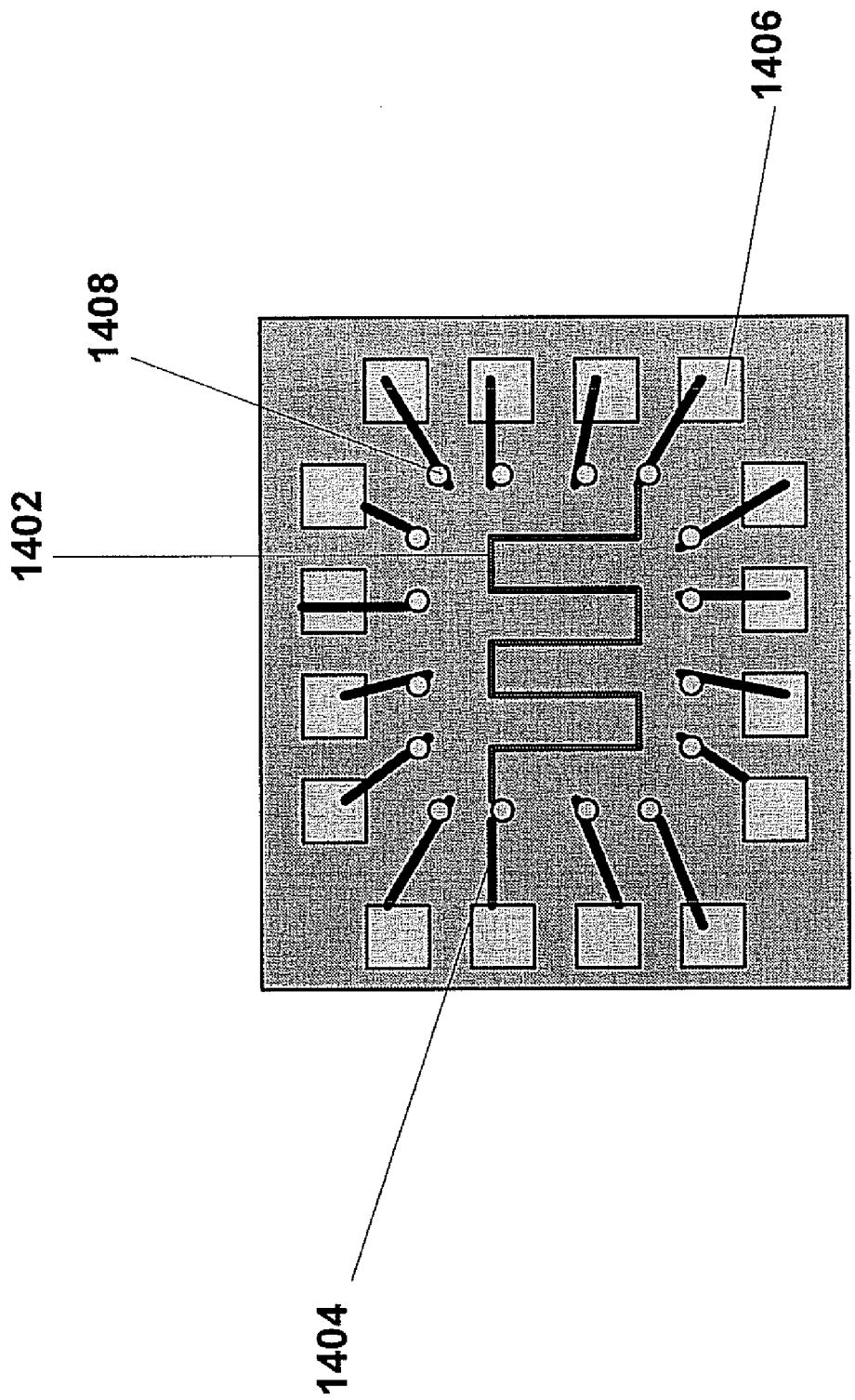
FIG. 14 illustrates a top view of the polyimide layer of FIG. 13 showing a gold metal trace that is used in magnetic coupling with the semiconductor die, wherein this layer is attached to die paddle of leadframe package.

FIG. 14 illustrates a top view of the polyimide layer of FIG. 13 showing a gold metal trace 1402 that is used in magnetic coupling. In addition, FIG. 13 also illustrates gold metal traces 1404 connecting the gold land 1406 for wire bond with gold land 1408 for gold bump.

Figure 15B:
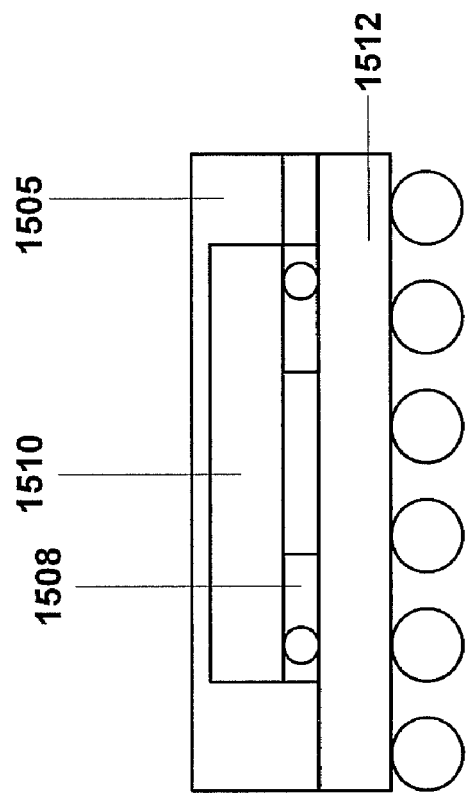
FIGS. 15a-b illustrate another embodiment of the present invention providing a BGA (OR LGA)-based isolator package.
Figure 15A:
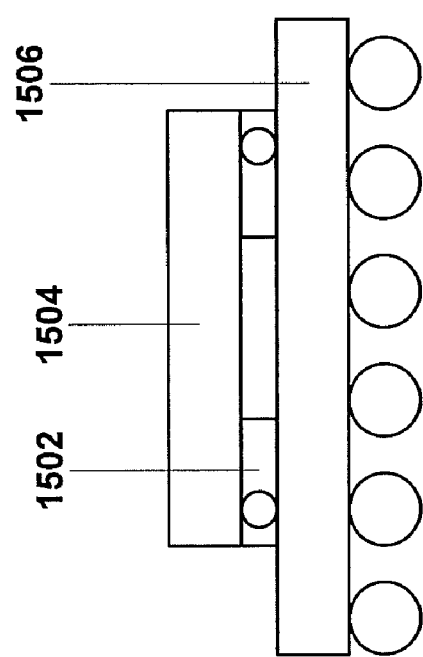

FIGS. 15a-b illustrate another embodiment of the present invention providing a laminate-based isolator package. FIGS. 15a illustrates a cross-section of the BGA (OR LGA)-based isolator package where the die is exposed. FIGS. 15b illustrates a cross-section section of the BGA (OR LGA)-based isolator package where the BGA (OR LGA) package is overmolded (molding layer 1505). In the exposed scenario of FIG. 15a, ACF film 1502 isolates metal traces on die 1506 from metal traces in substrate 1506. Similarly, in the overmolded scenario of FIG. 15b, ACF film 1508 isolates metal traces on die 1510 from metal traces in substrate 1512. It should noted that in the embodiment shown in FIG. 15, there is no need for a polyimide layer with metal trace as the metal traces for magnetic coupling are available on the BGA (OR LGA) laminate. Additionally, there is no wirebond in this BGA (OR LGA) embodiment.

CONCLUSION

A system and method has been shown in the above embodiments for the effective implementation of a stress free package and a laminate-based isolator package. While various preferred embodiments have been shown and described, it will be understood that there is no intent to limit the invention by such disclosure, but rather, it is intended to cover all modifications falling within the spirit and scope of the invention, as defined in the appended claims. For example, the present invention should not be limited by the type of material used as the perimeter.

The invention claimed is:

1. A method to reduce stress in a semiconductor package comprising:
    depositing a die perimeter around an area on a semiconductor die; and
    forming an air gap between the semiconductor die and a lead frame paddle by contacting the die perimeter with the lead frame paddle, wherein the formed air gap prevents underfill or molding compound from coming in contact with the area on the semiconductor die that faces the lead frame paddle.

2. The method of claim 1, wherein, prior to forming the air gap, the method further comprises the step of depositing a non-conductive second tier window frame perimeter around the lead frame, wherein the second tier perimeter forms the air gap with the die perimeter by contacting the die perimeter with the second tier perimeter.

3. The method of claim 1, wherein the die perimeter is formed of polymer.

4. The method of claim 3, wherein the die perimeter is formed via screen printing.

5. A method to reduce stress in a semiconductor package comprising:
    depositing a non-conductive window frame lead frame perimeter on a lead frame paddle; and
    contacting the lead frame perimeter with a semiconductor die, wherein the lead frame perimeter forms an air gap and prevents underfill or molding compound from coming in contact with an area on the semiconductor die that faces the lead frame paddle.

6. The method of claim 5, wherein, prior to contacting the lead frame perimeter with a semiconductor die, the method further comprises the step of depositing a window frame die perimeter around an area of the semiconductor die.

7. The method of claim 5, wherein the lead frame perimeter is formed of polymer.

8. The method of claim 1, wherein the die perimeter is discontinuous.

9. The method of claim 1, wherein the die perimeter is deposited on the semiconductor die at wafer level.

10. The method of claim 2, wherein the die perimeter is discontinuous.

11. The method of claim 10, wherein the die perimeter and second tier perimeter form a notch at the discontinuity in the die perimeter.

12. The method of claim 1, the method further comprising mounting the semiconductor die on leads adjacent to the paddle.

13. The method of claim 6, wherein the die perimeter is discontinuous.

14. The method of claim 6, wherein the die perimeter is deposited on the semiconductor die at wafer level.

15. The method of claim 14, wherein the die perimeter is discontinuous.

16. The method of claim 13, wherein the lead frame perimeter and die perimeter form a notch at the discontinuity in the die perimeter.

17. The method of claim 5, the method further comprising mounting the semiconductor die on leads adjacent to the paddle.

* * * * *